United States Patent
Ahn et al.

(10) Patent No.: US 9,508,411 B2
(45) Date of Patent: Nov. 29, 2016

(54) WORD LINE DRIVER CIRCUIT AND RESISTANCE VARIABLE MEMORY APPARATUS HAVING THE SAME

(71) Applicant: SK hynix Inc., Icheon-si, Gyeonggi-do (KR)

(72) Inventors: Chang Yong Ahn, Icheon-si (KR); Yoon Jae Shin, Icheon-si (KR)

(73) Assignee: SK HYNIX INC., Gyeonggi-Do (KR)

( * ) Notice: Subject to any disclaimer, the term of this patent is extended or adjusted under 35 U.S.C. 154(b) by 0 days.

(21) Appl. No.: 14/486,432

(22) Filed: Sep. 15, 2014

(65) Prior Publication Data

US 2015/0364174 A1    Dec. 17, 2015

(30) Foreign Application Priority Data

Jun. 5, 2014  (KR) .................. 10-2014-0068219

(51) Int. Cl.
| | |
|---|---|
| *G11C 8/10* | (2006.01) |
| *G11C 8/08* | (2006.01) |
| *G11C 7/08* | (2006.01) |
| *G11C 13/00* | (2006.01) |
| *G11C 11/408* | (2006.01) |

(52) U.S. Cl.
CPC ............. *G11C 8/08* (2013.01); *G11C 13/0028* (2013.01); *G11C 11/4085* (2013.01)

(58) Field of Classification Search
CPC ............................. G11C 8/08; G11C 11/4085
USPC ........... 365/148, 158, 163, 203, 230.06, 191
See application file for complete search history.

(56) References Cited

U.S. PATENT DOCUMENTS

| | | | |
|---|---|---|---|
| 6,272,057 B1* | 8/2001 | Koshikawa | 365/200 |
| 6,335,893 B1* | 1/2002 | Tanaka et al. | 365/226 |
| 2002/0163843 A1* | 11/2002 | Sim et al. | 365/204 |
| 2003/0137889 A1* | 7/2003 | Lee | 365/204 |
| 2005/0128858 A1* | 6/2005 | Lee et al. | 365/230.06 |
| 2008/0080229 A1* | 4/2008 | Choi et al. | 365/148 |
| 2009/0040851 A1* | 2/2009 | Mori et al. | 365/201 |
| 2009/0207645 A1* | 8/2009 | Parkinson | 365/145 |
| 2012/0195142 A1* | 8/2012 | Lee et al. | 365/194 |

FOREIGN PATENT DOCUMENTS

KR    1020100054259 A    5/2010

* cited by examiner

*Primary Examiner* — Ly D Pham
(74) *Attorney, Agent, or Firm* — William Park & Associates Ltd.

(57) ABSTRACT

A word line driver circuit according to an embodiment includes a driving unit configured to output a sub word line driving signal in response to a word line select signal and a main word line driving signal, a transmission unit configured to transmit the sub word line driving signal to a word line in response to a first enable signal, and a precharge unit configured to precharge a potential of the word line.

19 Claims, 7 Drawing Sheets

WORD LINE DRIVER CIRCUIT AND RESISTANCE VARIABLE MEMORY APPARATUS HAVING THE SAME

CROSS-REFERENCES TO RELATED APPLICATION

The present application claims priority under 35 U.S.C. §119(a) to Korean application number 10-2014-0068219, filed on Jun. 5, 2014, in the Korean Intellectual Property Office, which is incorporated herein by reference in its entirety.

BACKGROUND

1. Technical Field

Various embodiments relate to a semiconductor integrated apparatus, and more particularly, to a word line driver circuit and a resistance variable memory apparatus having the same.

2. Related Art

A semiconductor memory cell may be realized in various types. For example, a selection device and a data storage unit which is coupled in series with the selection device may be realized as a unit memory cell. A memory cell array may be configured by forming unit memory cells at respective intersection regions between a plurality of bit lines and a plurality of word lines.

If the size of a word line driver is small and the number of selection devices to drive is large, a time constant (tau=R*C) increases correspondingly. Therefore, a time that is required to turn on all selection devices electrically coupled to a selected word line and form current paths to memory cells cannot help but be lengthened.

A read or write operation in a semiconductor memory apparatus may be performed without an error when it is performed after current paths to memory cells are formed. Thus, a time that is required to turn on all selection devices coupled to a selected word line is directly associated with time-related characteristics and economic effects of a product.

SUMMARY

In an embodiment, a word line driver circuit comprises a driving unit configured to output a sub word line driving signal in response to a word line select signal and a main word line driving signal. The word line driver circuit may also comprise a transmission unit configured to transmit the sub word line driving signal to a word line in response to a first enable signal. In addition, the word line driver circuit may comprise a precharge unit configured to precharge a potential of the word line.

In an embodiment, a resistance variable memory apparatus comprises a memory cell array including a plurality of resistance variable memory cells electrically coupled between a plurality of word lines and a plurality of bit lines. The resistance variable memory apparatus may also comprise a row selection unit configured to decode a row address signal, provide a sub word line driving signal generated in response to a main word line driving signal and a word line select signal generated in response to the decoded row address signal, to a word line in response to a first enable signal, and discharge a potential of the word line.

DETAILED DESCRIPTION

Hereinafter, a word line driver circuit and a resistance variable memory apparatus having the same according to the disclosure will be described below with reference to the accompanying drawings through various embodiments.

Figure 1:
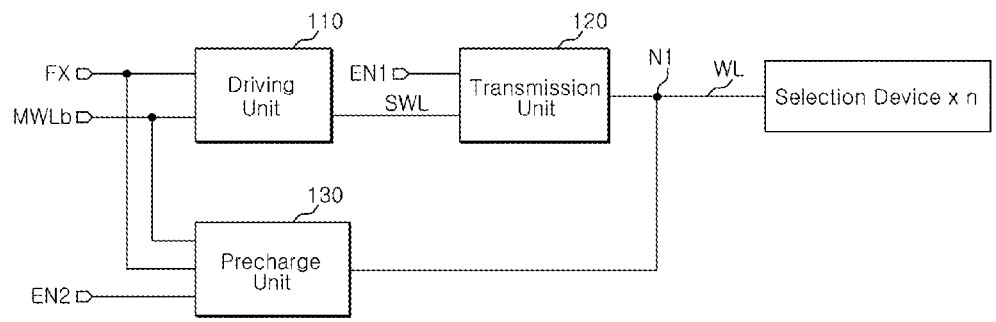
FIG. 1 is a configuration diagram of a word line driver circuit in accordance with an embodiment.

Referring to FIG. 1, a configuration diagram of a word line driver circuit in accordance with an embodiment is shown.

A word line driver may include a main word line driver and a sub word line operation unit. The main word line driver may be applied with an address signal outputted from an address decoder and a power supply voltage. The main word line driver may output a main word line driving signal MWLb. The sub word line driving unit may output a sub word line driving signal SWL in response to the main word line driving signal MWLb.

FIG. 1 shows a word line driver 10 which includes the sub word line driver operating in response to the main word line driving signal MWLb.

The word line driver 10 according to an embodiment may include a driving unit 110, a transmission unit 120, and a precharge unit 130.

The driving unit 110 outputs the sub word line driving signal SWL in response to a word line select signal FX and the main word line driving signal MWLb. The word line select signal FX may be generated in response to the address signal outputted from the address decoder.

The transmission unit 120 transmits the sub word line driving signal SWL to a word line WL in response to a first enable signal EN1.

The precharge unit 130 is driven in response to the word line select signal FX, the main word line driving signal MWLb, and a second enable signal EN2. The precharge unit 130 may be configured to precharge the potential of a first node N1 before the transmission unit 120 transmits the sub word line driving signal SWL to the first node N1.

Therefore, since the sub word line driving signal SWL having passed through the driving unit 110 and the transmission unit 120 is transmitted to the word line WL through the first node N1 in the state in which the potential of the first node N1 electrically coupled with the word line WL is precharged, it is possible to quickly drive a plurality of (for example, n number of) selection devices electrically coupled to the word line WL.

Figure 2:
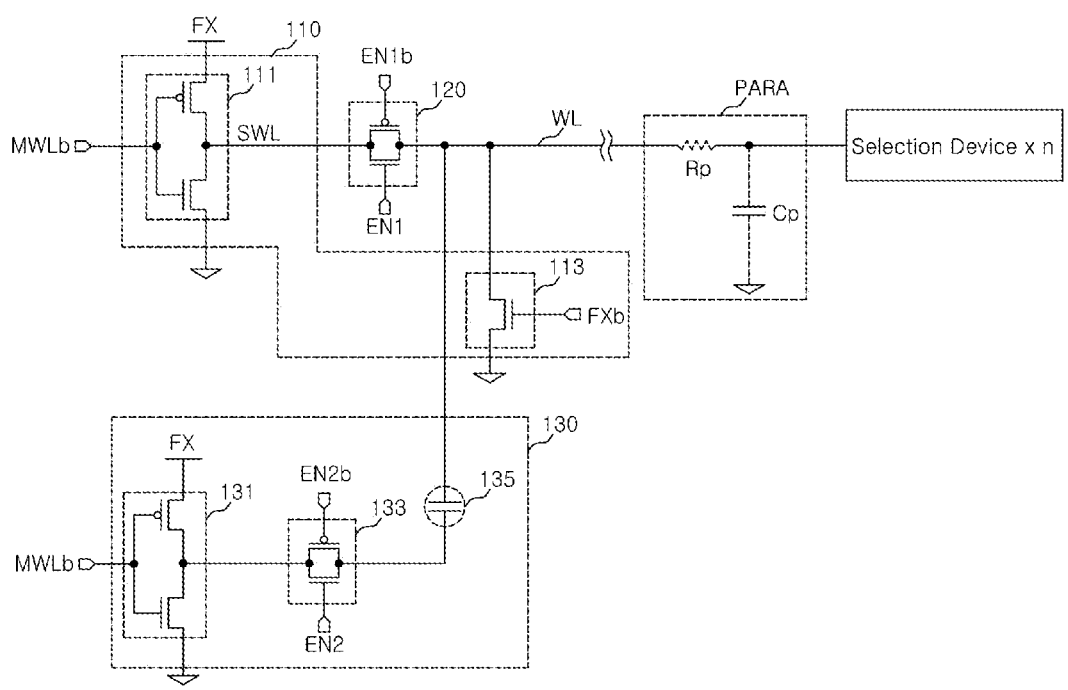
FIG. 2 is a diagram showing an embodiment of the word line driver circuit shown in FIG. 1.

Referring to FIG. 2, an embodiment of a word line driver circuit 10-1 is shown.

The driving unit 110 may include a first inverter 111 which is electrically coupled between the supply terminal of the word line select signal FX and a ground terminal, is driven by the main word line driving signal MWLb and outputs the sub word line driving signal SWL. The driving unit 110 may further include a discharge section 113 to pull down the word line WL after a read or write operation. The discharge section 113 may be, for example, but not limited to, a switching element electrically coupled between the word line WL and the ground terminal and driven by an inverted word line select signal FXb.

The transmission unit 120 may be a transmission device which transmits the sub word line driving signal SWL to the first node N1 in response to the first enable signal EN1 and an inverted first enable signal EN1b. The first enable signal EN1 may be, for example, but not limited to, a pulse generated by delaying the word line select signal FX by a first preset time.

The precharge unit 130 may include a second inverter 131, a transmitting section 133, and a pull-up section 135. The second inverter 131 may be electrically coupled between the supply terminal of the word line select signal FX and the ground terminal. In addition, the second inverter 131 may be driven by the main word line driving signal MWLb. The transmitting section 133 is electrically coupled to the output node of the second inverter 131, driven by a second enable signal EN2 and an inverted second enable signal EN2b, transmits the output signal of the second inverter 131. The pull-up section 135 precharges the potential transmitted through the transmitting section 133, to the first node N1. In an embodiment, the pull-up section 135 may be configured by, but not limited to, a capacitor.

The second enable signal EN2 may be, for example, a pulse signal generated by delaying the word line select signal FX by a second preset time shorter than the first preset time. More specifically, the first enable signal EN1 and the second enable signal EN2 may be generated by delaying the same source signal by the first preset time and the second preset time shorter than the first preset time.

As the transmitting section 133 is driven by the second enable signal EN2, the potential of the first node N1 is precharged in advance. In this state, as the first enable signal EN1 is driven and the sub word line driving signal SWL is supplied to the word line WL, it is possible to quickly drive the plurality of (the n number of) selection devices electrically coupled to the word line WL.

A parasitic component PARA by parasitic resistance Rp and parasitic capacitance Cp is present in the word line WL. Such a parasitic component PARA is a factor that determines a delay time until the sub word line driving signal SWL outputted from the word line driver circuit 10-1 turns on all selection transistors. Accordingly, as the length of the word line is long or the number of the selection devices electrically coupled to the word line WL increases, a time constant cannot help but be increased. Further, the delay time for turning on all the selection devices is in proportional to the time constant.

In an embodiment, after the potential of the word line WL is raised by at least a predetermined level through the precharge unit 130, the sub word line driving signal SWL is supplied. As a result, it is possible to shorten a time required to turn on all the selection devices electrically coupled to the selected word line WL.

Figure 3:
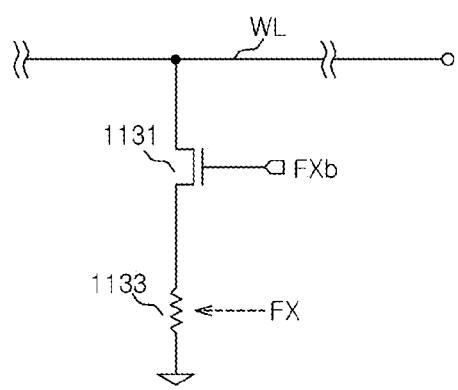
FIG. 3 is a diagram showing an embodiment of the discharge section shown in FIG. 2.

To reduce the parasitic resistance Rp configuring the parasitic component PARA, the discharge section 113 may be configured as shown in FIG. 3.

A discharge section 113-1 shown in FIG. 3 may include a switching element 1131 electrically coupled to the word line WL and driven by the inverted word line select signal FXb. The discharge section 113-1 may also include a resistance reducing part 1133 electrically coupled between the switching element 1131 and the ground terminal.

The resistance reducing part 1133 may be configured by a resistance element capable of forming parallel resistance with respect to the parasitic resistance Rp. For example, the resistance reducing part 1133 may be a passive resistance element. In an example, the resistance reducing part 1133 may be a switching element driven by the word line select signal FX.

The resistance value of the resistance reducing part 1133 may be determined as a substantially low value, and particularly, may be determined as a value which may satisfy an operation time required in the standard of a semiconductor memory apparatus.

When a specific word line WL is selected and driven for a read or write operation, the parasitic resistance Rp present in the word line WL and the resistance reducing part 1133 form parallel resistance. Accordingly, it is possible to decrease a time constant for the selection devices disposed far away from the word line driver. As a result, it is possible to set up the potential of the word line WL at a high speed.

Figure 4:
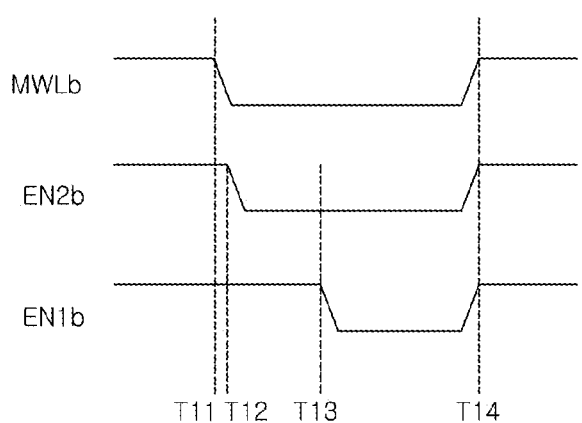
FIG. 4 is an operation timing diagram of the word line driver circuit shown in FIG. 2.

Referring to FIG. 4, an operation timing diagram of the word line driver circuit shown in FIG. 2 is illustrated.

In a read or write operation, the main word line driving signal MWLb is enabled (T11), and the second enable signal EN2 is enabled to a specific level, for example, a high level (T12). Then, the transmitting section 133 is driven by the second enable signal EN2 and the inverted second enable signal EN2b. In addition, the potential corresponding to the word line select signal FX is charged to the first node N1 through the pull-up section 135.

Thereafter, when the first enable signal EN1 is enabled to a specific level, for example, a high level (T13), the transmission unit 130 driven by the first enable signal EN1 and the inverted first enable signal EN1b transmits the sub word line driving signal SWL to the first node N1.

When the main word line driving signal MWLb and the first and second enable signals EN1 and EN2 are disabled (T14), the read or write operation is ended.

Figure 5:
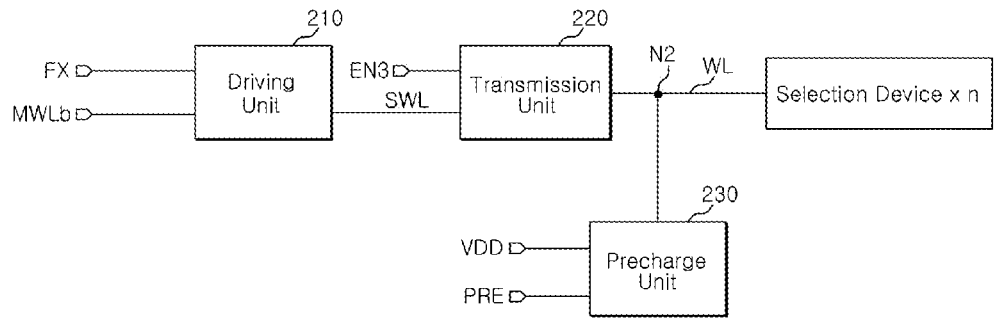
FIG. 5 is a configuration diagram of a word line driver circuit in accordance with an embodiment.

Referring to FIG. 5, a configuration diagram of a word line driver circuit in accordance with an embodiment is shown.

A word line driver 20 according to an embodiment may include a driving unit 210, a transmission unit 220, and a precharge unit 230.

The driving unit 210 outputs a sub word line driving signal SWL in response to a word line select signal FX and a main word line driving signal MWLb.

The transmission unit 220 transmits the sub word line driving signal SWL to a word line WL in response to a third enable signal EN3.

The precharge unit 230 is supplied with a power supply voltage VDD, and driven in response to a precharge signal PRE. The precharge unit 230 may be configured to precharge the potential of a second node N2 before the transmission unit 220 transmits the sub word line driving signal SWL to the second node N2.

Therefore, since the sub word line driving signal SWL having passed through the driving unit 210 and the transmission unit 220 is transmitted to the word line WL through the second node N2 in the state in which the potential of the second node N2 electrically coupled with the word line WL is precharged, it is possible to quickly drive a plurality of (for example, n number of) selection devices electrically coupled to the word line WL.

Figure 6:
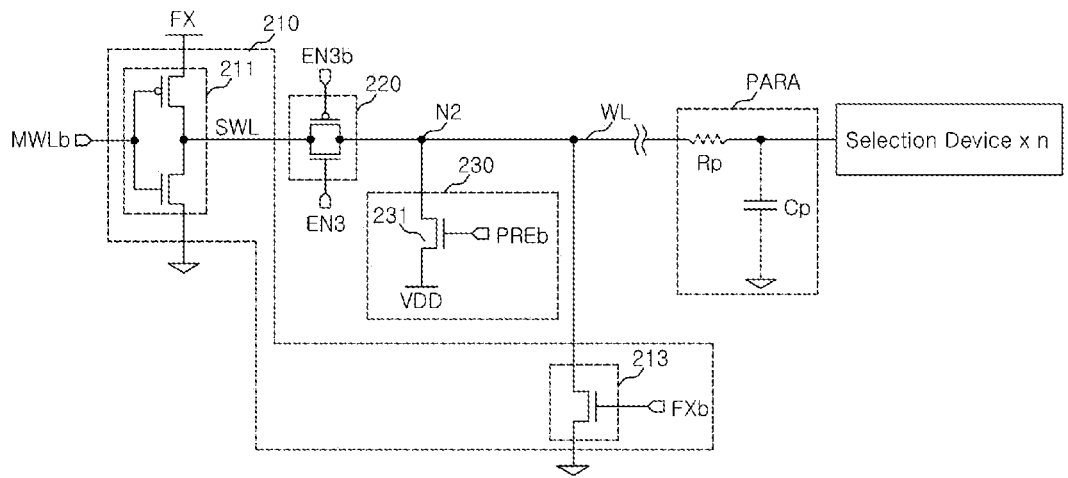
FIG. 6 is a diagram showing an embodiment of the word line driver circuit shown in FIG. 5.

Referring to FIG. 6, a diagram showing an embodiment of the word line driver circuit shown in FIG. 5 is illustrated.

In a word line driver circuit 20-1 according to an embodiment, the driving unit 210 may include an inverter 211 and a discharge section 213. Since the configurations of the inverter 211 and the discharge section 213 are similar to or the same as the first inverter 111 shown in FIG. 2 and the discharge section 113 shown in FIG. 2 or the discharge section 113-1 shown in FIG. 3, the detailed descriptions will be omitted.

The transmission unit 220 may be, but not limited to, a transmission device driven by the third enable signal EN3 and an inverted third enable signal EN3b and transmits the sub word line driving signal SWL to the second node N2. In an embodiment, the third enable signal EN3 may be, but not limited to, a pulse signal generated by delaying the main word line driving signal MWLb by a first preset time.

The precharge unit 230 may include a switching element 231 electrically coupled between the second node N2 and the terminal of a power supply voltage VDD and driven by a precharge signal PREb. The precharge signal PREb may be, but not limited to, a pulse signal generated by delaying the main word line driving signal MWLb by a second preset time shorter than the first preset time.

It is sufficient that the third enable signal EN3 and the precharge signal PREb are configured in such a manner that the third enable signal EN3 is enabled after the precharge signal PREb retains an enabled state for a preset period, regardless of what are the source signals of the third enable signal EN3 and the precharge signal PREb.

Figure 7:
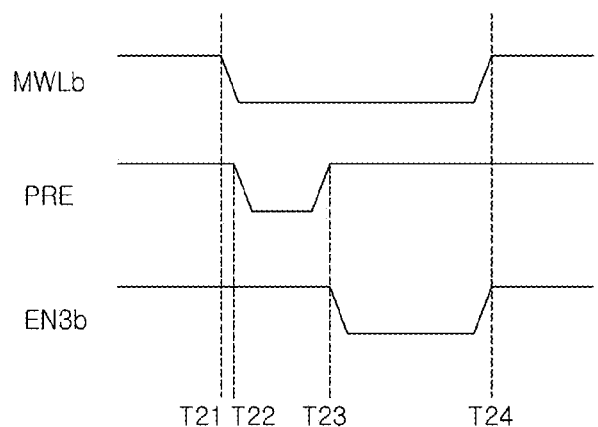
FIG. 7 is an operation timing diagram of the word line driver circuit shown in FIG. 6.

Accordingly, referring to FIG. 7, in a read or write operation, as the main word line driving signal MWLb is enabled (T21) and the precharge signal PREb is successively enabled (T22), the potential of the second node N2 is precharged. Thereafter, when the third enable signal EN3 is enabled (T23), the sub word line driving signal SWL is transmitted to the second node N2 through the transmission unit 220.

When the main word line driving signal MWLb, the precharge signal PREb and the third enable signal EN3 are disabled (T24), the read or write operation is ended.

Figure 8:
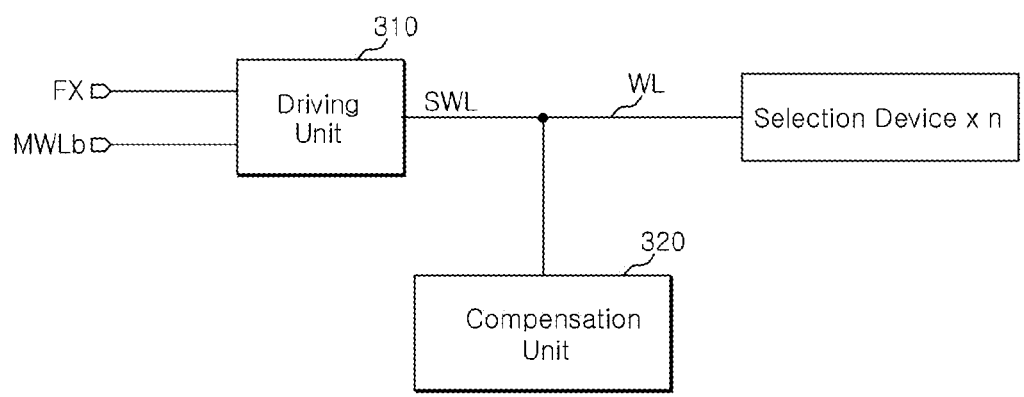
FIG. 8 is a configuration diagram of a word line driver circuit in accordance with an embodiment.

Referring to FIG. 8, a configuration diagram of a word line driver circuit in accordance with an embodiment is shown.

A word line driver circuit 30 shown in FIG. 8 may include a driving unit 310 and a compensation unit 320.

The driving unit 310 outputs a sub word line driving signal SWL in response to a word line select signal FX and a main word line driving signal MWLb.

The compensation unit 320 compensates for the time constant of the word line WL by configuring parallel resistance with respect to parasitic resistance present in the word line WL.

Figure 9:
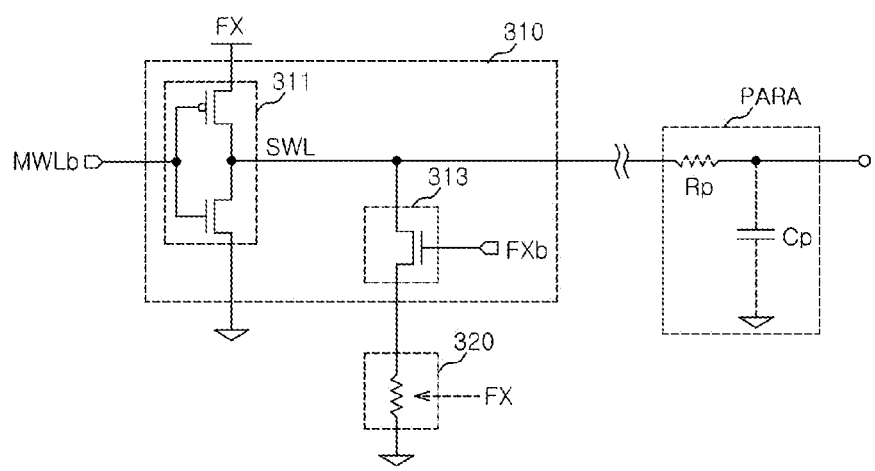
FIG. 9 is a diagram showing an embodiment of the word line driver circuit shown in FIG. 8.

Referring to a word line driver circuit 30-1 shown in FIG. 9, a driving unit 310 may include an inverter 311 and a discharge section 313. Since the configurations of the inverter 311 and the discharge section 313 may be the same as or substantially similar to those described with reference to FIGS. 2 and 3, the detailed descriptions will be omitted.

The compensation unit 320 may be configured as a resistance element capable of forming parallel resistance with respect to parasitic resistance Rp of a parasitic component PARA present in the word line WL. For example, the compensation unit 320 may be a passive resistance element. In an example, the compensation unit 320 may be a switching element driven by the word line select signal FX.

The resistance value of the compensation unit 320 may be determined as a substantially low value, and particularly, may be determined as a value which may satisfy an operation time required in the standard of a semiconductor memory apparatus.

When a specific word line WL is selected and driven for a read or write operation, the parasitic resistance Rp present in the word line WL and the compensation unit 320 form parallel resistance. Accordingly, it is possible to decrease a time constant for the selection devices disposed far away from the word line driver circuit. As a result, it is possible to set up the potential of the word line WL at a high speed.

A semiconductor memory apparatus is being highly integrated. Accordingly, the number of a selection devices electrically coupled to one word line is huge.

Figure 10:
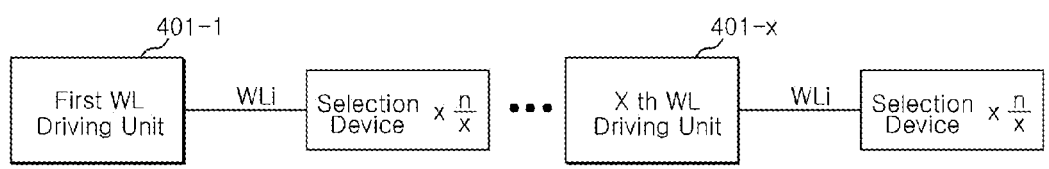
FIG. 10 is a configuration diagram of a word line driver circuit in accordance with an embodiment.

Accordingly, a sub word line for driving one word line may be configured in a plural number, shown in FIG. 10.

Referring to FIG. 10, a word line driver circuit 40 may include x number of word line driving units 401-1 to 401-x such that it is possible to drive n number of selection devices electrically coupled to a specific word line WLi, through dividing them by x.

Each of the word line driving units 401-1 to 401-x may be configured by the sub word line driver shown in FIG. 1, 5 or 8. As selection devices are driven by being grouped, the number of selection devices to be driven by a unit word line driving unit 401-1 to 401-x is decrease, and accordingly, a time required to set up a word line may be significantly shortened as well.

This resultantly means that current paths may be formed at a high speed before performing a read or write operation and thus it is possible to ensure the high speed operation of a semiconductor memory apparatus due to a decrease in latency.

Figure 11:
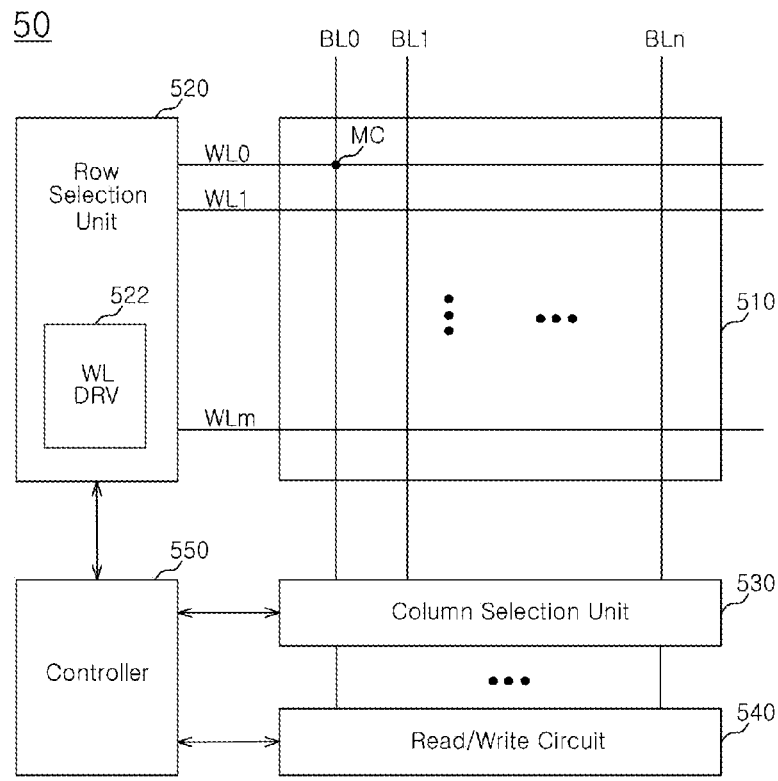
FIG. 11 is a configuration diagram of a resistance variable memory apparatus in accordance with an embodiment.

Referring to FIG. 11, a configuration diagram of a resistance variable memory apparatus in accordance with an embodiment is shown.

A resistance variable memory apparatus 50 according to an embodiment may include a memory cell array 510, a row selection unit 520, a column selection unit 530, a read/write circuit 540, and a controller 550.

Figure 12:
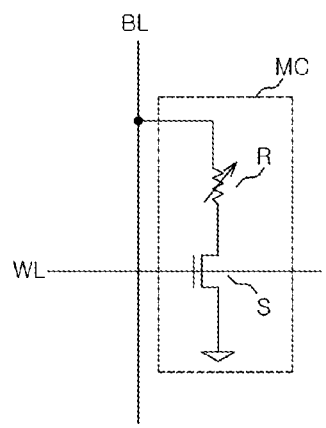
FIG. 12 is a diagram showing an embodiment of a unit memory cell which is applied to the disclosure.

The memory cell array 510 may include a plurality of memory cells MC electrically coupled between a plurality of bit lines BL0 to BLn and a plurality of word lines WL0 to WLm. Each of the plurality of memory cells MC may include a selection device S and a data storage part R as shown in FIG. 12. The selection device S may be a transistor driven by a signal applied to the word line WL and electrically coupled between the data storage part R and a ground terminal. In particular, the selection device S may be configured by a vertical transistor. The data storage part R may be formed by a material electrically coupled between the drain terminal of the selection device S and a bit line BL and of which resistance value is changed according to an amount of current applied, and may be formed by using, for example, a phase change material.

The row selection unit 520 decodes a row address signal provided from an exterior, drives the decoded row address signal, and supplies it to the word line. To this end, the row selection unit 520 may include a word line driver circuit (WL DRV) 522. The word line driver circuit (WL DRV) 522 may include a main word line driver applied with the decoded row address signal and a power supply voltage and outputs a main word line driving signal, and a sub word line driver which outputs a sub word line driving signal in response to the main word line driving signal. The sub word line driver may be configured using the word line driver circuit 10, 20, 30 or 40 shown in FIG. 1, 5, 8 or 10. Therefore, since a sub word line driving signal may be supplied to a word line with the output node of the sub word line driving signal precharged in advance when a specific word line is selected, it is possible to turn on the selection devices electrically coupled to the corresponding word line, at a high speed.

The column selection unit 530 decodes a column address signal which is provided from the exterior, and drives a bit line according to an operation mode.

The read/write circuit 540 reads and outputs data from selected memory cells of the memory cell array 510 in a read operation. The read/write circuit 540 also writes data in selected memory cells in a write operation.

The controller 550 controls the entire operations of the resistance variable memory apparatus 50.

The selection device S of the resistance variable memory apparatus 50 is recently designed as a surround gate type vertical transistor. While the surround gate type means a type in which a gate material surrounds a pillar type channel region, such a type of transistor has a characteristic that driving resistance is substantially large. Therefore, as in the embodiments, by precharging in advance a node to be supplied with a sub word line driving signal or by adding a resistance element capable of forming parallel resistance with respect to parasitic resistance in a word line, it is possible to decrease the time constant of a signal to be transmitted through the word line. As a result, this leads to an effect of decreasing the operation latency of a resistance variable memory apparatus, whereby it is possible to contribute to the high speed operation of the memory apparatus.

Figure 13:
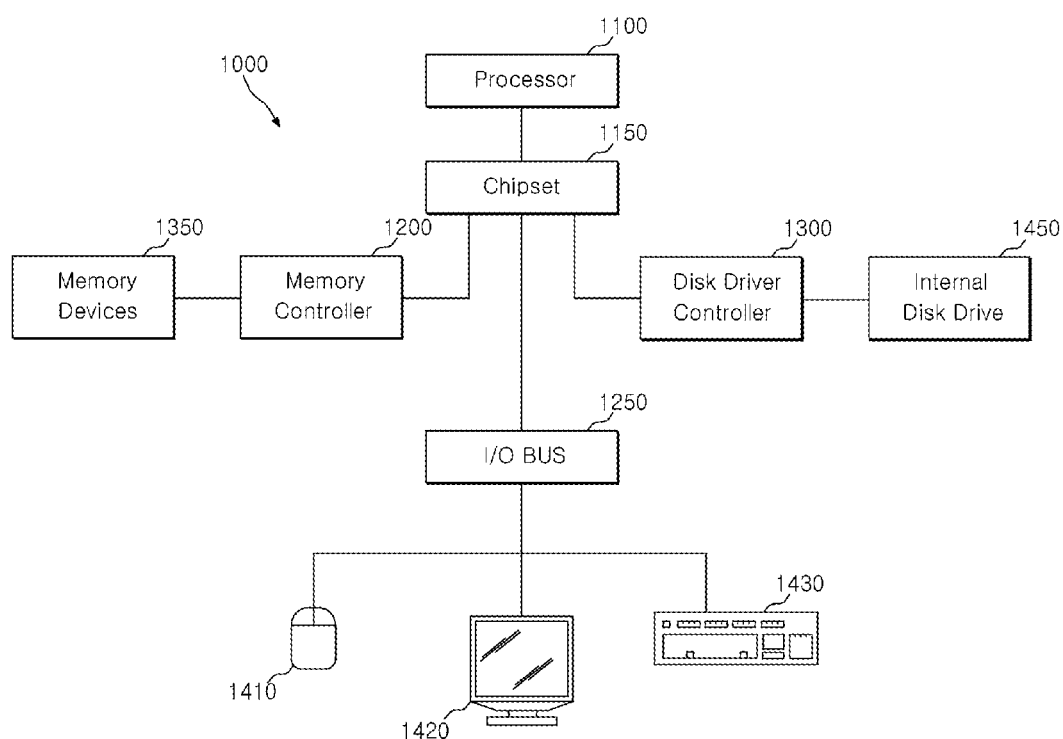
FIG. 13 illustrates a block diagram of a system employing a memory controller circuit in accordance with an embodiment of the invention.

Referring to FIG. 13, a system 1000 may include one or more processors 1100. The processor 1100 may be used individually or in combination with other processors. A chipset 1150 may be operably electrically coupled to the processor 1100. The chipset 1150 is a communication pathway for signals between the processor 1100 and other components of the system 1000. Other components may include a memory controller 1200, an input/output ("I/O") bus 1250, and a disk drive controller 1300. Depending on the configuration of the system 1000, any one of a number of different signals may be transmitted through the chipset 1150.

The memory controller 1200 may be operably electrically coupled to the chipset 1150. The memory controller 1200 can receive a request provided from the processor 1100 through the chipset 1150. The memory controller 1200 may be operably electrically coupled to one or more memory devices 1350. The memory device 1350 may include the word line driver circuit described above.

The chipset 1150 may also be electrically coupled to the I/O bus 1250. The I/O bus 1250 may serve as a communication pathway for signals from the chipset 1150 to I/O devices 1410, 1420 and 1430.

The I/O devices 1410, 1420 and 1430 may include a mouse 1410, a video display 1420, or a keyboard 1430. The I/O bus 1250 may employ any one of a number of communications protocols t communicate with the I/O devices 1410, 1420 and 1430.

The disk drive controller 1300 may also be operably electrically coupled to the chipset 1150. The disk drive controller 1300 may serve as the communication pathway between the chipset 1150 and one or more internal disk drives 1450. The disk drive controller 1300 and the internal disk drives 1450 may communicate with each other or with the chipset using virtually any type of communication protocol.

While certain embodiments have been described above, it will be understood to those skilled in the art that the embodiments described are by way of example only. Accordingly, the word line driver circuit and a resistance variable memory apparatus having the same described should not be limited based on the described embodiments. Rather, the word line driver circuit and a resistance variable memory apparatus having the same described should only be limited in light of the claims that follow when taken in conjunction with the above description and drawings.

What is claimed is:

1. A word line driver circuit comprising:
    a driving unit configured to output a sub word line driving signal in response to a word line select signal and a main word line driving signal;
    a transmission unit configured to transmit the sub word line driving signal to a word line in response to a first enable signal; and
    a precharge unit configured to precharge a potential of the word line before the sub word line driving signal is provided to the word line.

2. The word line driver circuit according to claim 1, wherein the precharge unit is driven by a second enable signal enabled earlier than the first enable signal.

3. The word line driver circuit according to claim 1, wherein the precharge unit comprises:
    an inverter electrically coupled between a supply terminal of the word line select signal and a ground terminal, and configured to be driven by the main word line driving signal;
    a transmitting section electrically coupled to an output node of the inverter, configured to be driven by the second enable signal and transmit an output signal of the inverter; and
    a pull-up section configured to precharge the potential of the word line in response to an output signal of the transmitting section.

4. The word line driver circuit according to claim 3, wherein the second enable signal is enabled earlier than the first enable signal.

5. The word line driver circuit according to claim 1, wherein the precharge unit is configured to drive and provide a power supply voltage to the word line according to a precharge signal.

6. The word line driver circuit according to claim 5, wherein the precharge signal is enabled earlier than the first enable signal.

7. The word line driver circuit according to claim 1, wherein the driving unit comprises:
    an inverter electrically coupled between the supply terminal of the word line select signal and the ground terminal, and configured to be driven by the main word line driving signal and output the sub word line driving signal; and
    a discharge section electrically coupled between the word line and the ground terminal, and configured to be driven in response to the word line select signal.

8. The word line driver circuit according to claim 7, wherein the precharge unit comprises:

a first switching device electrically coupled to the word line, and configured to be driven by the word line select signal; and a resistance reducing part electrically coupled between the first switching device and the ground terminal.

9. The word line driver circuit according to claim 8, wherein the resistance reducing part includes a passive resistance element.

10. The word line driver circuit according to claim 8, wherein the resistance reducing part includes a second switching device driven by the word line select signal.

11. A resistance variable memory apparatus comprising:

a memory cell array including a plurality of resistance variable memory cells electrically coupled between a plurality of word lines and a plurality of bit lines; and a row selection unit configured to decode a row address signal, provide a sub word line driving signal generated in response to a main word line driving signal and a word line select signal generated in response to the decoded row address signal, to a word line in response to a first enable signal, and precharge a potential of the word line before the sub word line driving signal is provided to the word line.

12. The resistance variable memory apparatus according to claim 11, wherein the row selection unit comprises a word line driver circuit comprising:

a driving unit configured to output the word line select signal;

a transmission unit configured to provide the sub word line driving signal to the word line in response to the first enable signal; and a precharge unit configured to precharge the potential of the word line.

13. The resistance variable memory apparatus according to claim 12, wherein the precharge unit is driven by a second enable signal enabled earlier than the first enable signal.

14. The resistance variable memory apparatus according to claim 12, wherein the precharge unit is configured to drive and provide a power supply voltage to the word line in response to a precharge signal.

15. The resistance variable memory apparatus according to claim 14, wherein the precharge signal is enabled earlier than the first enable signal.

16. The resistance variable memory apparatus according to claim 12, wherein the driving unit comprises:

an inverter electrically coupled between a supply terminal of the word line select signal and a ground terminal, and configured to be driven by the main word line driving signal and output the sub word line driving signal; and a discharge section electrically coupled between the word line and the ground terminal, and configured to be driven in response to the word line select signal.

17. The resistance variable memory apparatus according to claim 16, wherein the discharge section comprises:

a first switching element electrically coupled to the word line, and configured to be driven by the word line select signal; and a resistance reducing section electrically coupled between the first switching element and the ground terminal.

18. The resistance variable memory apparatus according to claim 17, wherein the resistance reducing section includes a passive resistance element.

19. The resistance variable memory apparatus according to claim 17, wherein the resistance reducing section includes a second switching element driven by the word line select signal.

* * * * *